(12) United States Patent
Nishimura

(10) Patent No.: US 10,133,177 B2
(45) Date of Patent: Nov. 20, 2018

(54) EXPOSURE APPARATUS, EXPOSURE METHOD, AND ARTICLE MANUFACTURING METHOD

(71) Applicant: CANON KABUSHIKI KAISHA, Tokyo (JP)

(72) Inventor: Mitsuhide Nishimura, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/097,585

(22) Filed: Apr. 13, 2016

(65) Prior Publication Data

US 2016/0306284 A1 Oct. 20, 2016

(30) Foreign Application Priority Data

Apr. 15, 2015 (JP) ................... 2015-083484
Mar. 30, 2016 (JP) ................... 2016-067408

(51) Int. Cl.
*G03F 7/32* (2006.01)
*G03F 9/00* (2006.01)
*G03F 7/20* (2006.01)

(52) U.S. Cl.
CPC ............ *G03F 7/32* (2013.01); *G03F 7/70641* (2013.01); *G03F 9/7026* (2013.01)

(58) Field of Classification Search
CPC ....... G03F 7/32; G03F 7/70641; G03F 9/7026
USPC ...................................... 430/22, 30
See application file for complete search history.

(56) References Cited

U.S. PATENT DOCUMENTS 5,742,067 A 4/1998 Imai

FOREIGN PATENT DOCUMENTS

| JP | 8227854 A | 9/1996 |
| JP | 2001093813 A | 4/2001 |
| JP | 2014099562 A | 5/2014 |

*Primary Examiner* — Christopher G Young
(74) *Attorney, Agent, or Firm* — Rossi, Kimms & McDowell LLP

(57) ABSTRACT

An exposure method of exposing a plurality of exposure regions on a substrate includes the steps of acquiring first reference information indicating a reference height of the substrate, measuring heights of some exposure regions among the plurality of exposure regions, acquiring temporary height information indicating a temporary height of the substrate on the basis of a measurement result in the measuring step, and exposing one exposure region among the plurality of exposure regions after the substrate is moved on the basis of second reference information indicating a reference height of the one exposure region and a difference between the first reference information and the temporary height information.

15 Claims, 13 Drawing Sheets

EXPOSURE APPARATUS, EXPOSURE METHOD, AND ARTICLE MANUFACTURING METHOD

BACKGROUND OF THE INVENTION

Field of the Invention

The present invention relates to an exposure apparatus, an exposure method, and an article manufacturing method.

Description of the Related Art

A projection exposure apparatus for transferring a pattern formed on an original plate (a reticle or the like) to a substrate (a wafer or the like on a surface of which a resist layer is formed) via a projection optical system is used when a semiconductor device or the like is manufactured. Typical types of projection exposure apparatuses include a step-and-repeat type reduction projection exposure apparatus (stepper) and a step-and-scanner type scanning projection exposure apparatus (scanner). For example, the stepper reduces a pattern of an original plate and projects the reduced pattern on each of a plurality of exposure regions (shot regions) on the substrate. However, when the substrate is tilted or a thickness of the substrate is not uniform, deviation (defocus) between the positions (heights) in the Z-axis direction (an optical axis direction of a projection optical system) of the shot region and the exposure focus occurs. It is necessary to perform focus drive for every shot region to prevent an exposure defect due to defocusing, but throughput is degraded when a time period necessary for focus drive is lengthened.

Therefore, an exposure method of shortening a time period of the focus drive is disclosed in Japanese Patent Laid-Open No. 2001-93813. In the exposure method of Japanese Patent Laid-Open No. 2001-93813, the height of the shot region is also measured when an alignment mark of a sample shot region is measured and the height of the substrate is adjusted simultaneously with the alignment adjustment on the basis of a measured value simultaneously with X-Y movement between exposure shot regions. Also, an exposure method of separately performing global leveling and chip leveling and returning to an orientation after the global leveling by adjusting the height of the substrate according to a leveling correction amount of a previous shot region before the chip leveling of the next shot region is disclosed in Japanese Patent Laid-Open No. H8-227854. An exposure method of calculating a correction value of focus adjustment for each of a plurality of shot regions of a second substrate is disclosed in Japanese Patent Laid-Open No. 2014-99562. In the publication of Japanese Patent Laid-Open No. 2014-99562, the correction value of the focus adjustment is calculated using a measured value of a height measured in each of a plurality of shot regions of a first substrate and a difference between measured values of heights measured in predetermined (single) shot regions of the first and second substrates.

However, when an accurate height of each shot region is desired to be measured in the exposure method of Japanese Patent Laid-Open No. 2001-93813, it is necessary to increase the number of sample shot regions in the alignment process and a measurement time period is lengthened, which degrades throughput. Also, when the unevenness of a substrate surface increases in the publication of Japanese Patent Laid-Open No. H8-227854, a drive amount for returning to the orientation after the global leveling for every shot region increases and the throughput is likely to be degraded. On the other hand, in the exposure method of the publication of Japanese Patent Laid-Open No. 2014-99562, the correction error may increase due to the unevenness or tilt of the substrate surface because the correction value is calculated using the difference between the measured values of the heights in the predetermined shot regions of the first and second substrates.

SUMMARY OF THE INVENTION

The present invention provides, for example, an exposure apparatus which is advantageous in terms of focusing precision and throughput.

The present invention is an exposure method of exposing a plurality of exposure regions on a substrate, the exposure method including the steps of: acquiring first reference information indicating a reference height of the substrate; measuring heights of some exposure regions among the plurality of exposure regions; acquiring temporary height information indicating a temporary height of the substrate on the basis of a measurement result in the measuring step; and exposing one exposure region among the plurality of exposure regions after the substrate is moved on the basis of second reference information indicating a reference height of the one exposure region and a difference between the first reference information and the temporary height information.

Further features of the present invention will become apparent from the following description of exemplary embodiments (with reference to the attached drawings).

DESCRIPTION OF THE EMBODIMENTS

Hereinafter, modes for carrying out the present invention will be described with reference to the drawings. The present invention can be applied to an apparatus for sequentially performing focus drive in a large number of shot regions, an apparatus for performing sequential exposure, or the like (a scanning type projection exposure apparatus, a position determination apparatus, or the like), and will be described below using an example of a reduction projection exposure apparatus (stepper).

Figure 1:
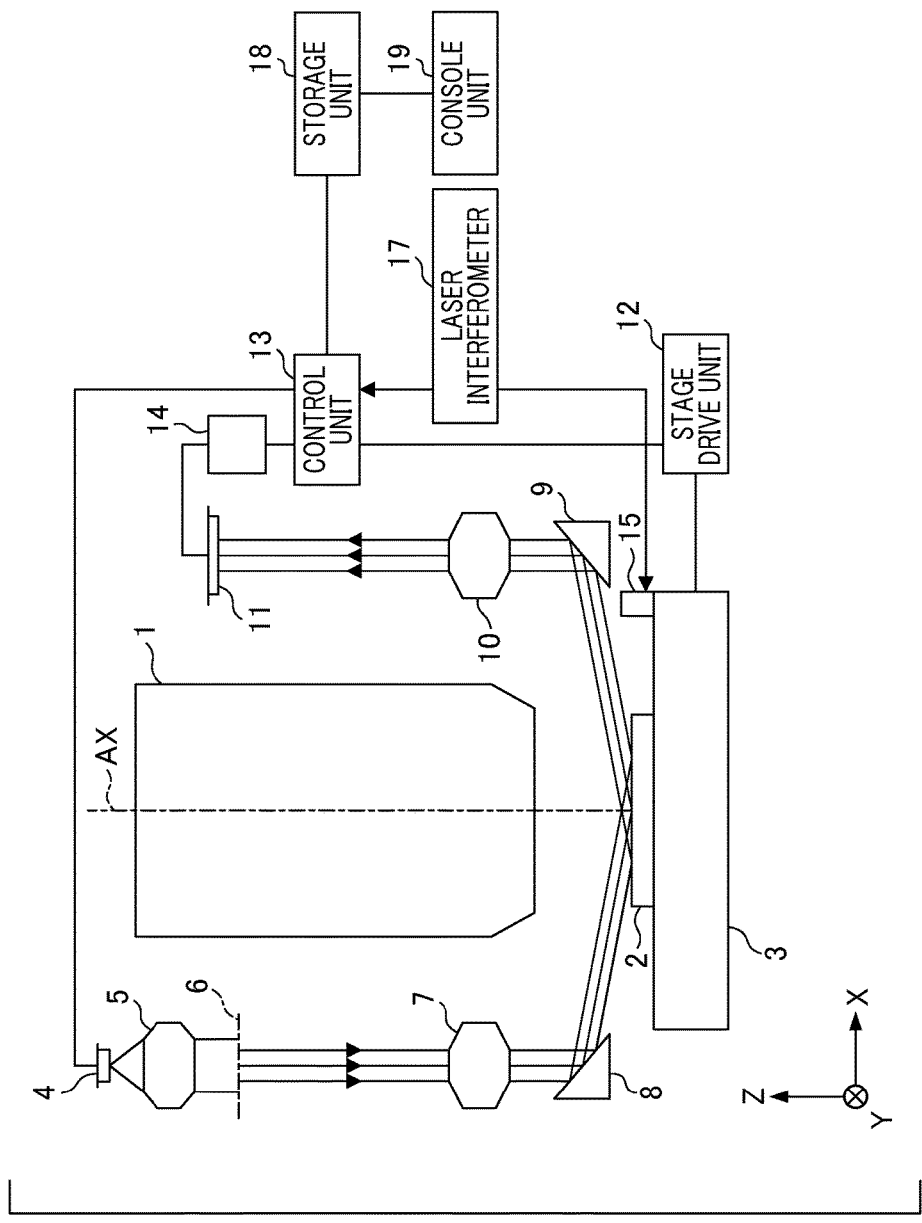
FIG. 1 is a schematic diagram illustrating a configuration of a reduction projection exposure apparatus according to an embodiment of the present invention.

FIG. 1 is a schematic diagram illustrating a configuration of a reduction projection exposure apparatus according to this embodiment. The reduction projection exposure apparatus includes a reduction projection lens system 1, an illumination optical system, a detection optical system, and a substrate stage 3. The reduction projection lens system 1 reduces and projects a circuit pattern of a reticle (not illustrated) and forms a circuit pattern image on its focus surface. An optical axis AX of the reduction projection lens system 1 is parallel to a Z-axis direction of FIG. 1 (a direction vertical to the surface of the substrate 2).

The illumination optical system includes an illumination light source 4, an illumination lens 5, a mask 6, an image forming lens 7, and a bending mirror 8. The illumination light source 4 is, for example, a light-emitting diode or a semiconductor laser. The mask 6 has a plurality of pinholes. Light emitted from the illumination light source 4 is a parallel light flux via the illumination lens 5 and is a plurality of light fluxes via the mask 6. After the light is incident on the bending mirror 8 via the image forming lens 7 and the direction is changed by the bending mirror 8, the light is incident on the surface of the substrate 2. At this time, an image of a plurality of pinholes provided in the mask 6 is formed on the substrate 2 (on the substrate).

Figure 2:
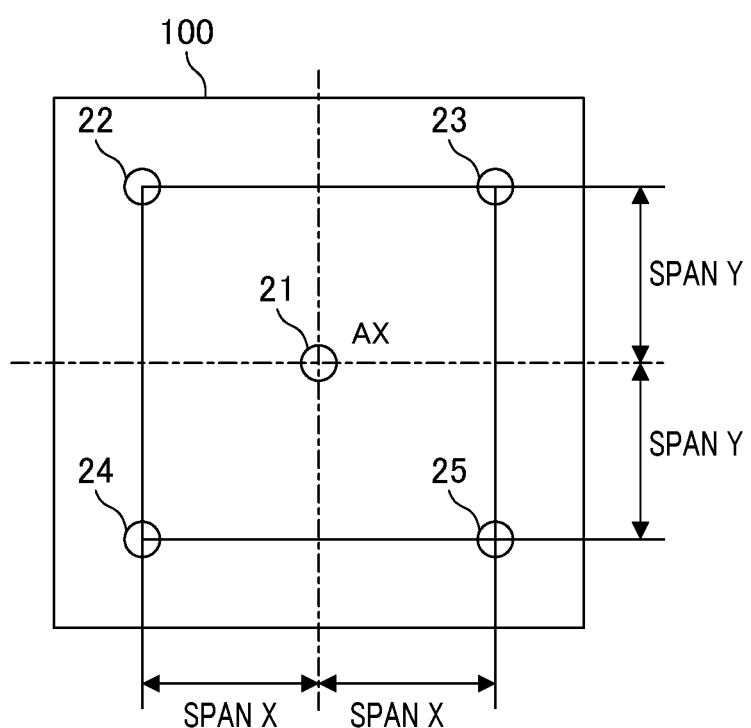
FIG. 2 is a diagram illustrating a position of an exposure position measurement point.

The detection optical system (measurement unit) includes a bending mirror 9, a detection lens 10, and a position detection element 11. FIG. 2 is a diagram illustrating an arrangement of exposure position measurement points in an exposure region 100 on the substrate 2. When five pinholes form one set in a plurality of pinholes provided in the mask 6, the light flux passing through the pinhole is radiated to measurement points 21 to 25 of five positions including a center of the exposure region 100 and reflected at each position. The measurement point 21 of the center is arranged at a position at a distance of a span X in the X-axis direction and a span Y in the Y-axis direction from the other measurement points. After the direction of the reflected light flux is changed by the bending mirror 9, the reflected light flux is incident on the position detection element 11 in which elements such as charge-coupled devices (CCDs) are two-dimensionally arranged via the detection lens 10. That is, the mask 6, the substrate 2, and the position detection element 11 are at mutually optically conjugate positions. Also, when there is difficulty in the optical arrangement, a plurality of position detection elements 11 may be arranged in correspondence with each pinhole. The position detection element 11 may independently detect incidence positions of a plurality of light fluxes via a plurality of pinholes in a light-receiving surface. The position and tilt of the optical axis AX direction of the substrate 2 for the reduction projection lens system 1 can be detected as deviations between incidence positions of a plurality of light fluxes on the position detection element 11.

The substrate stage 3 sucks and holds the substrate 2 and is movable in an X-axis direction, a Y-axis direction, a Z-axis direction, and rotation directions Qx, Qy, and Qz about these axes. Here, a surface along (for example, parallel to) the surface of the substrate 2 serves as an XY plane and a direction (optical axis AX direction) vertical to the XY plane serves as a Z-axis direction. The height of the substrate stage 3 (substrate 2) indicates a position coordinate in the Z-axis direction. Also, magnitudes (rad) of the rotation directions Qx, Qy, and Qz indicate a degree of a tilt of the substrate stage 3. The movement of the substrate stage 3 is performed by a stage drive unit 12 and it is possible to adjust the position and tilt of the substrate 2 according to the movement of the substrate stage 3. Here, the substrate 2 is a substrate to be processed, wherein the substrate has a surface coated with a photosensitive material and a large number of exposure regions (shot regions) are arranged on the substrate.

The position of the substrate 2 in the Z-axis direction detected by the detection optical system and the tilt with respect to the X axis and the Y axis are input to a control unit 13 via a surface position detection unit 14 as output signals (measurement results) from the position detection element 11. The control unit (generation unit) 13 generates a predetermined command signal (drive command) and transmits the predetermined command signal (drive command) to the stage drive unit 12 on the basis of the input signals (measured values). The stage drive unit 12 responds to the received command signal and adjusts the height and tilt of the substrate 2 by performing servo drive on the substrate stage 3. The position of the substrate 2 in the X-axis/Y-axis direction and the tilt with respect to the Z axis are measured using a reference mirror 15 and a laser interferometer 17 provided on the substrate stage 3. Likewise, the stage drive unit 12 adjusts the position and tilt of the substrate 2 on the XY plane.

A storage unit 18 stores the position of the substrate and the exposure position. Also, all values said to be stored hereinafter are assumed to be stored in the storage unit 18 or an alternative apparatus. A console unit 19 performs parameter setting. Also, when the reduction projection exposure apparatus according to this embodiment does not include a user interface as shown in the console unit 19, the control unit 13 can execute each parameter as a fixed value. Also, this embodiment is achieved by providing the exposure apparatus with a storage medium storing program codes of software for implementing functions to be described below and reading and executing the program codes stored in a storage medium by a computer (or a central processing unit (CPU) or main processing unit (MPU)).

Figure 3:
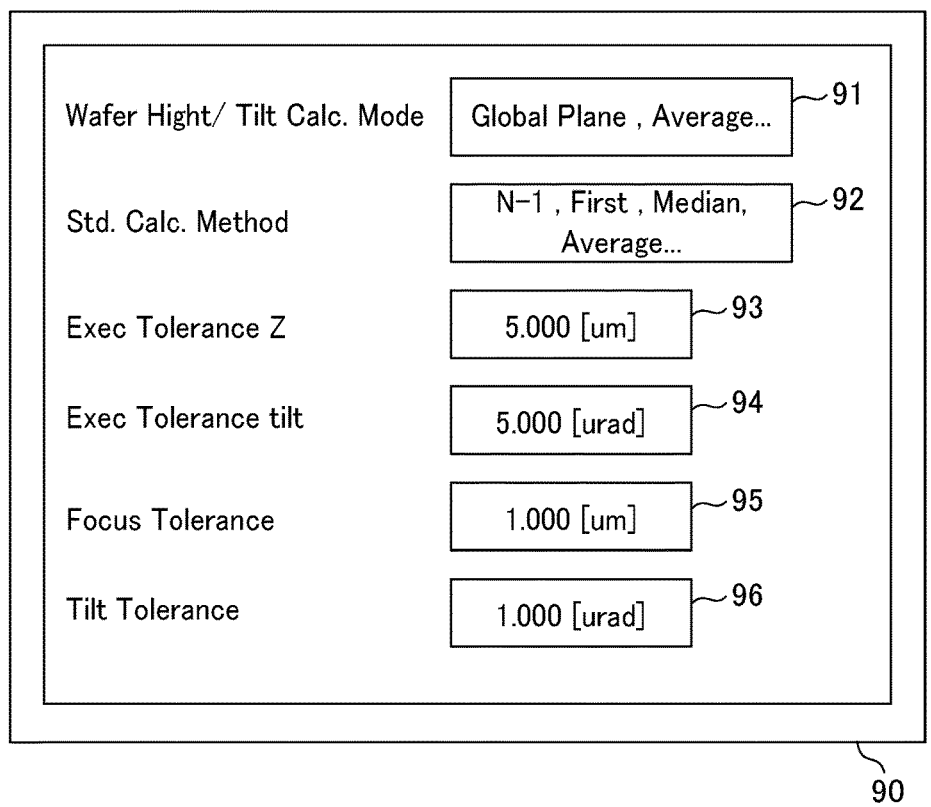
FIG. 3 is a diagram illustrating various setting screens of a console unit.

FIG. 3 is a diagram illustrating various setting screens in the console unit 19. A parameter 91 is a parameter for determining a method of calculating a value related to a height of the substrate. A parameter 92 is a parameter for determining information as a basis for processing second and subsequent substrates and a method of calculating a reference exposure position. Threshold values 93 and 94 (predetermined threshold values) are height and tilt threshold values of a substrate serving as references for determining whether to execute driving for a predictive exposure position (a predictive position indicating a position of prediction). Threshold values 95 and 96 are threshold values for determining tolerance ranges of errors of a position and a tilt in the Z-axis direction of a focus measurement value at a predictive exposure position. The predictive exposure position indicates a predictive position of a height direction of the substrate of the exposure target.

Figure 4:
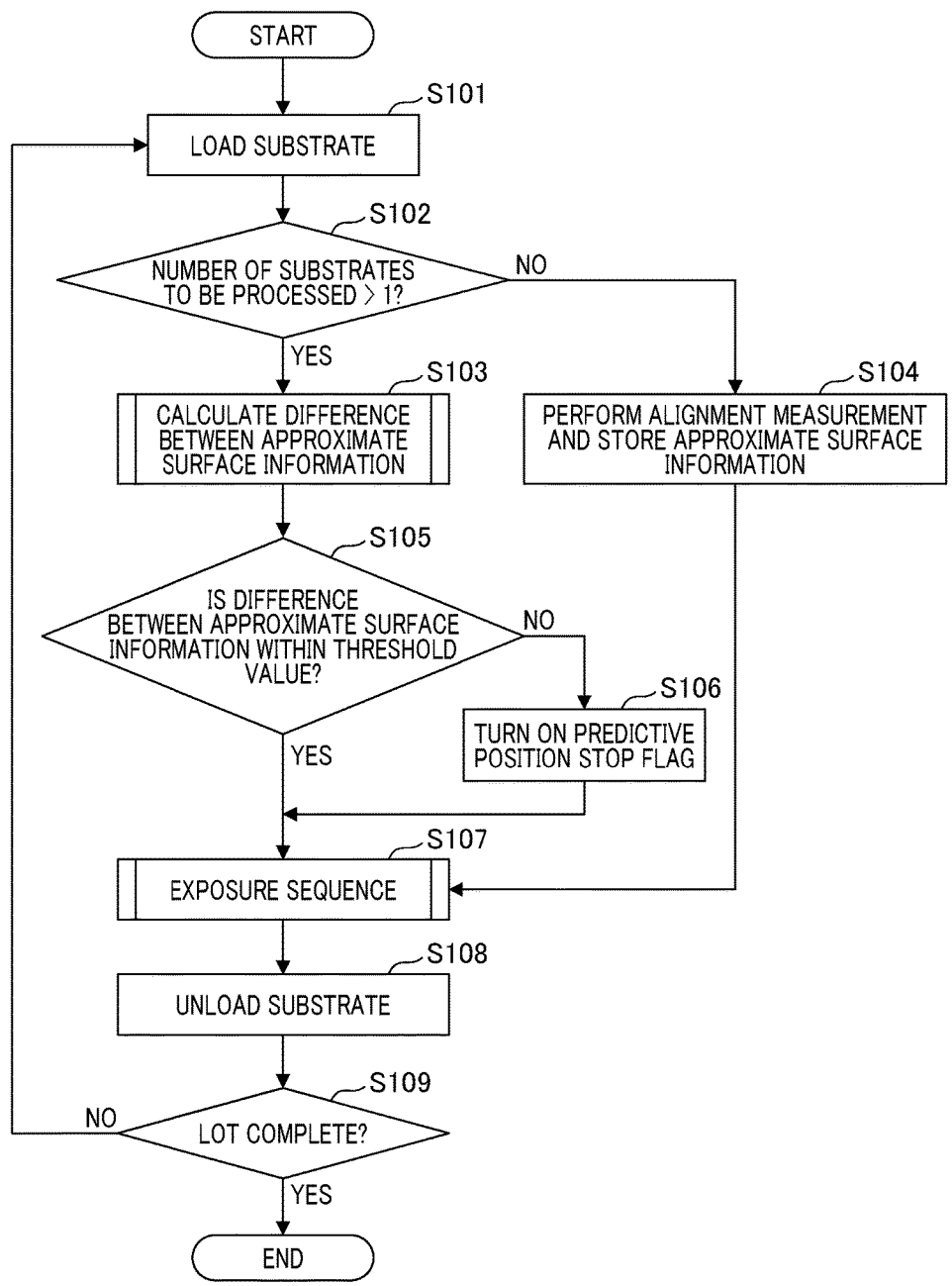
FIG. 4 is a flowchart illustrating a sequence of all processing processes.

FIG. 4 is a flowchart illustrating a sequence of the entire processing process of sequentially exposing a plurality of shot regions of a substrate through a reduction projection exposure apparatus according to this embodiment. First, the sequence when a first substrate of a lot (the number of substrates to be processed is 1) is a processing target will be described. Also, the variation of the thicknesses of substrates within the lot is about 20 μm at maximum, and when a difference between the thicknesses of substrates (Semiconductor Equipment and Materials International (SEMI) standard) is less than or equal to 20 μm, the substrates are regarded to belong to the same lot. The following sequence is assumed to be performed for each lot. For example, the same pattern is formed in a substrate belonging to the same lot and various processes (heat treatment, etching, etc.) are performed in the same condition after exposure. First, the substrate 2 is loaded onto the substrate stage 3 by a substrate loading apparatus (not illustrated) (S101). In S102, it is determined whether the number of substrates to be processed is greater than 1. Because the substrate is the first substrate of the lot, it is determined to be not and the process proceeds to step S104. In S104, the height and tilt of the substrate 2 are measured with the alignment measurement in each sample shot region, and the control unit 13 calculates a value (approximate surface information) related to the height of the substrate 2 on the basis of measured values and stores calculation results in the storage unit 18. As sample shot regions, a plurality of shot regions in number less than the total number of all shot regions of the substrate 2 are selected. The approximate surface information is information indicating the height of each region of the substrate 2 obtained by performing calculation for complementing a height position other than that of the sample shot region on the basis of a position of the height direction of each sample shot region. That is, the approximate surface information is information indicating a distribution of heights.

Figure 6:
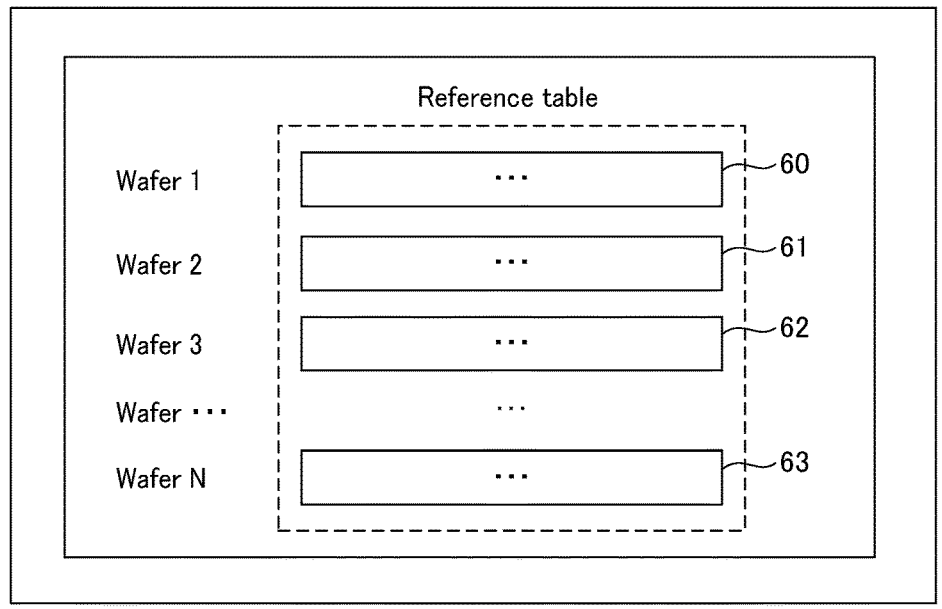
FIG. 6 is a diagram illustrating content stored by a storage unit.
Figure 7:
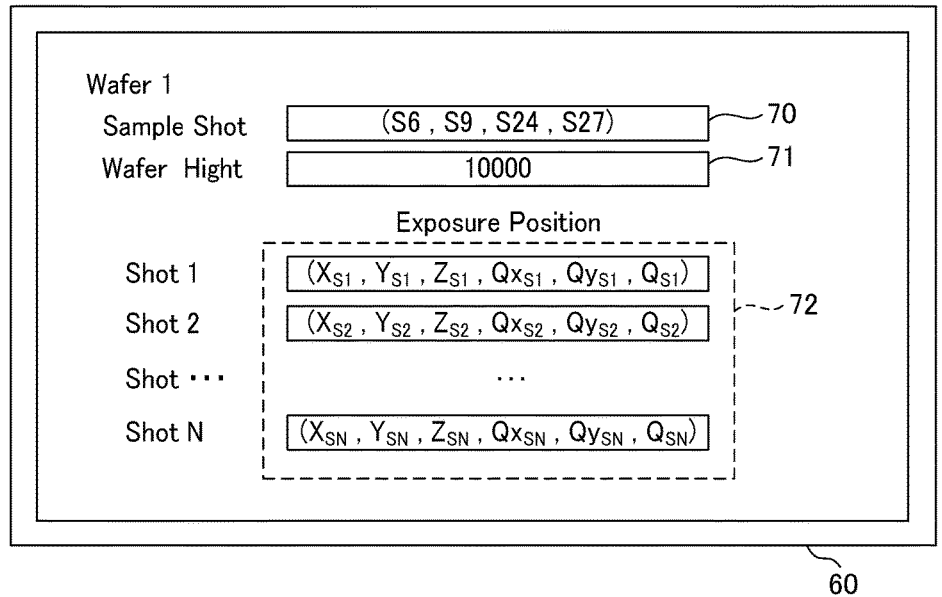
FIG. 7 is a diagram illustrating details of storage content of FIG. 6.

FIG. 6 is a table storing approximate surface information of each substrate, an exposure position of a shot region, etc. stored in the storage unit 18. Tables corresponding to first, second, third, . . . , and $n^{th}$ substrates (wafer 1 to wafer N) within the same lot are denoted by reference numerals 60, 61, 62, and 63. FIG. 7 is, for example, a diagram illustrating data stored in the table 60.

Figure 8:
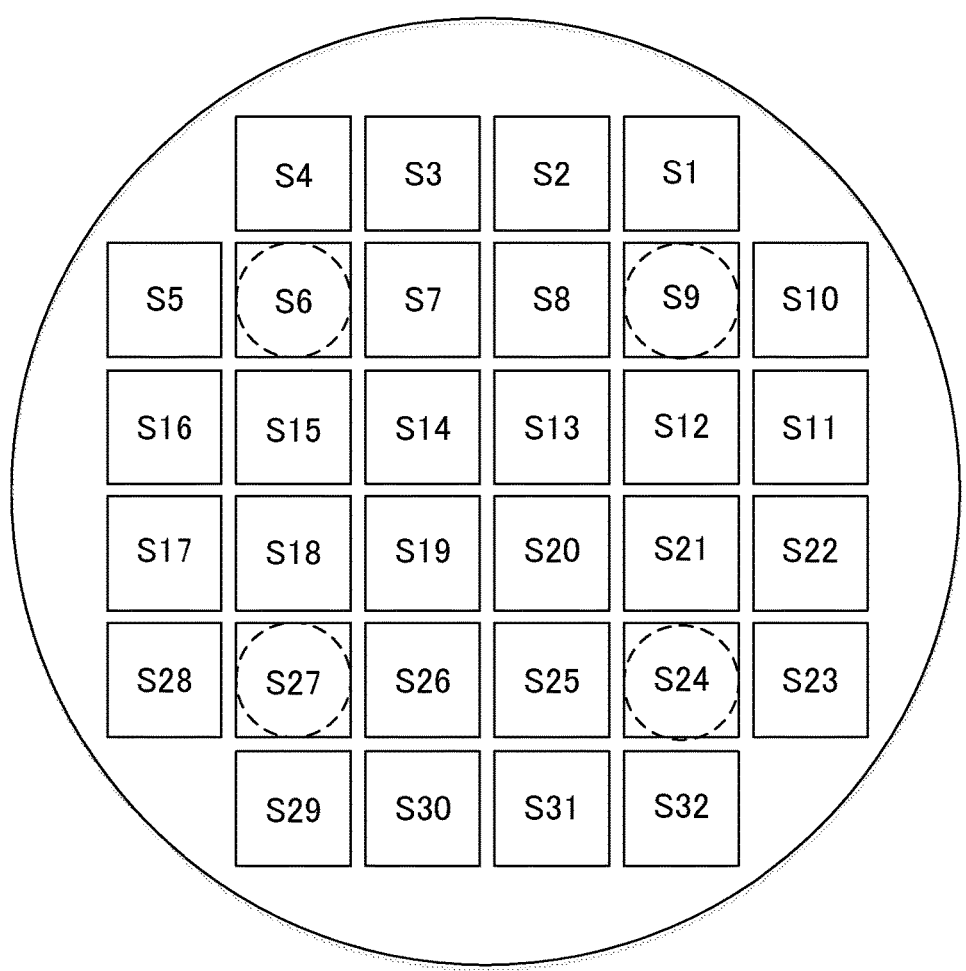
FIG. 8 is a diagram illustrating an example of a sample shot region in alignment measurement.

FIG. 8 is a plan view illustrating an example of a sample shot region during alignment measurement. In this example, shot regions of S6, S9, S24, and S27 which are some exposure regions among a plurality of exposure regions are sample shot regions (sample regions) in the alignment measurement. The number and positions of sample shot regions can be appropriately set. In this case, in the table 60 of FIG. 6, S6, S9, S24, and S27 are stored as sample shot regions 70 and the height (approximate surface information) of the substrate calculated from the measured value in each sample shot region (heights of some exposure regions among the plurality of exposure regions) is stored as a wafer height 71.

As a method of calculating a height of the substrate, there is, for example, a method using a least square plane. When the surface of the substrate is expressed by a formula of z=ax+by+c, the least square plane is a plane for which a, b, and c obtained from a least square method can be substituted into an equation of the above-described plane. The height of the substrate serving as the approximate surface information is represented by c on the right side of the above-described formula and the tilt of the substrate is represented by a and b of the above-described formula. These are stored in the table corresponding to each substrate illustrated in FIG. 6. Also, these may be calculated by obtaining a mean regardless of the least square plane. The calculation method can be selected according to the parameter 91 of the console unit 19.

Hereinafter, a method of calculating a, b, and c according to the least square method will be described. Assuming that the number of sample shot regions is n and coordinates of each measured sample shot region are (xi, yi, zi), a difference ri between the height of each sample shot region obtained by the formula and the height of each measured sample shot region can be expressed by the following formula.

$$ri = axi + byi + c - zi$$

An average V of a sum of squares of ri is expressed as follows.

$$V = (1/n)\Sigma(ri^2)$$
$$= (1/n)\Sigma(axi + byi + c - zi)^2$$

Because a, b, and c for which V is minimized are obtained, an extreme value for which the partial derivative is 0 is obtained for a, b, and c. A result of partial differentiation is as follows.

$$(\delta V / \delta a) = (2/n)\Sigma(axi + byi + c - zi)xi$$
$$= (2/n)(a\Sigma(xi)^2 + b\Sigma xiyi + c\Sigma xi - \Sigma xizi)$$
$$= 0$$

$$(\delta V / \delta b) = (2/n)\Sigma(axi + byi + c - zi)yi$$
$$= (2/n)(a\Sigma xiyi + b\Sigma(yi)^2 + c\Sigma yi - \Sigma yizi)$$
$$= 0$$

$$(\delta V / \delta c) = (2/n)\Sigma(axi + byi + c - zi)$$
$$= (2/n)(a\Sigma xi + b\Sigma yi + nc - \Sigma zi)$$
$$= 0$$

Here, the terms are replaced as follows to solve the above-described simultaneous equations.

$$(1/n)\Sigma(xi)^2 = X = A$$

$$(1/n)\Sigma(yi)^2 = Y = B$$

$$(1/n)\Sigma xiyi = Z = C$$

$$(1/n)\Sigma xi = x = D$$

$$(1/n)\Sigma yi = y = E$$

$$(1/n)\Sigma xizi = \alpha = F$$

$$(1/n)\Sigma yizi = \beta = G$$

$$(1/n)\Sigma zi = \gamma = H$$

Thereby, the above-described simultaneous equations are replaced with the following matrix.

$$\begin{pmatrix} X & Z & x \\ Z & Y & y \\ x & y & 1 \end{pmatrix} \begin{pmatrix} a \\ b \\ c \end{pmatrix} = \begin{pmatrix} \alpha \\ \beta \\ \gamma \end{pmatrix} \quad [\text{Math 1}]$$

When this matrix is solved, a, b, and c are obtained as follows.

$$a = (VyF + VzG + UyH)/I$$

$$b = (VzF + VxG + UxH)/I$$

$$c = (UyF + UxG + UzH)/I$$

Here, the right sides of the formulas use the following replacements.

$$Vx = X - x^2 = A - D^2$$

$$Vy = Y - y^2 = B - E^2$$

$$Vz = xy - Z = DE - C$$

$$Ux = xZ - yX = DC - EA$$

$$Uy = yZ - xY = EC - DB$$

$$Uz = XY - Z^2 = AB - C^2$$

$$I = VxVy - Vz^2$$

Figure 5:
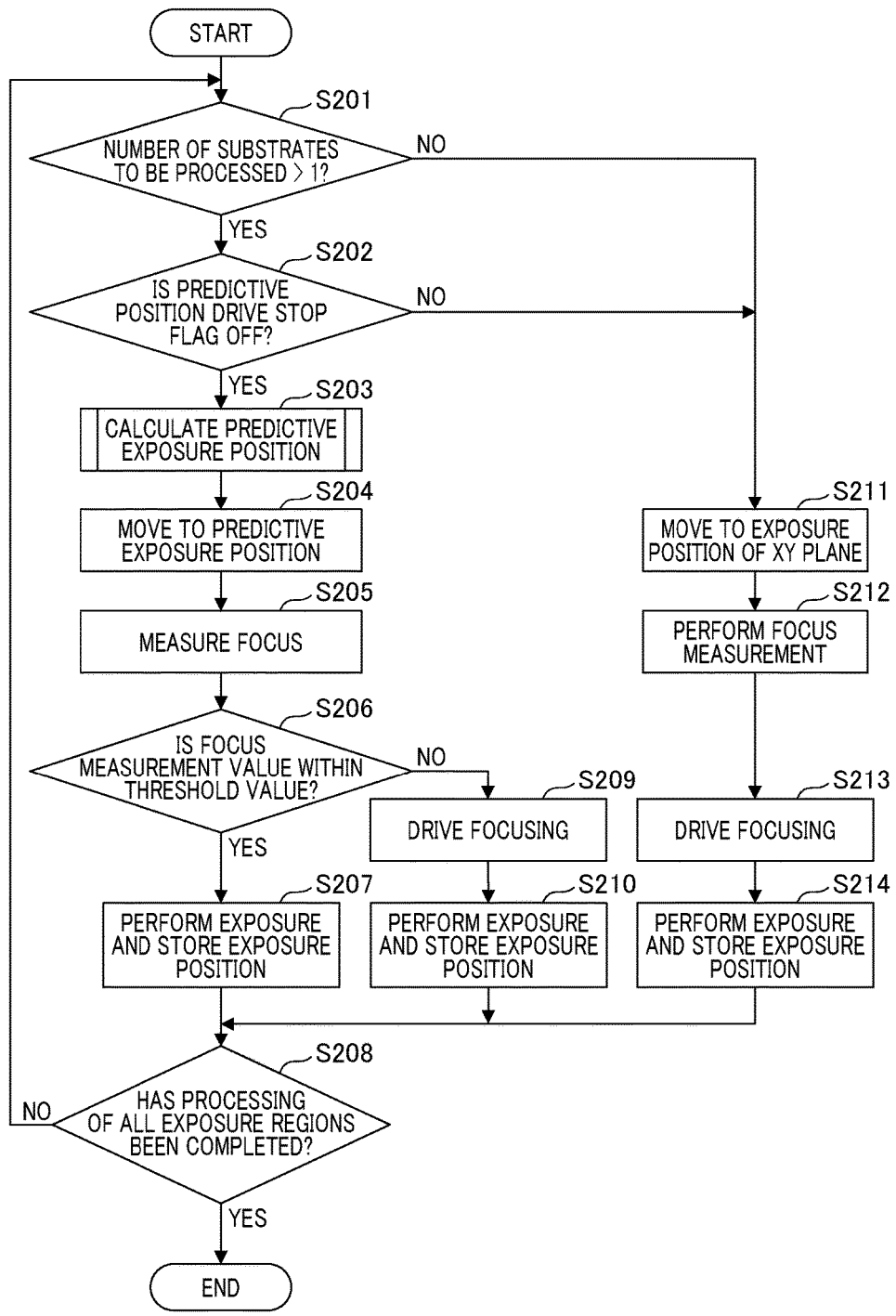
FIG. 5 is a flowchart illustrating a flow of an exposure step.

After the approximate surface information of the first substrate (first reference information indicating a reference height of the substrate) is stored in the storage unit 18 in S104, an exposure process (exposure sequence) is executed (S107). FIG. 5 is a flowchart illustrating a flow of the exposure process of S107. First, in S201, it is determined whether the number of substrates to be processed is greater than 1. Because the substrate is the first substrate of the lot, it is determined to be not and the process proceeds to step S211. In S211, the substrate 2 is moved to an exposure position in the XY plane. In the example illustrated in FIG. 8, the movement from the final shot region S27 of alignment measurement to a shot region S1 is performed. Next, focus measurement is performed in S212. The position or tilt of the shot region S1 in the Z-axis direction is measured. In S213, focusing drive is performed on the basis of the measured value. The exposure position is stored in the storage unit 18 simultaneously when the exposure is executed in S214. Here, the exposure position is position coordinates of the substrate stage 3 (substrate 2) during exposure of each exposure region (shot region) indicated by reference numeral 72 of FIG. 7 and is, specifically, ($X_{S1}$, $Y_{S1}$, $Z_{S1}$, $Qx_{S1}$, $Qy_{S1}$, $Qz_{S1}$) or the like. Also, the exposure apparatus may reflect an alignment error of focus obtained by measuring the focuses of one shot region after moving the substrate to the predictive drive position and before the shot region (one exposure region) that is the target of exposure is exposed. Next, it is determined whether the processing of all exposure regions has been completed in S208. When it is determined that the processing has not been completed, the process returns to S201 and the exposure process is re-executed. In the example illustrated in FIG. 8, the movement from the shot region S1 to the shot region S2 is performed and the exposure process on the shot region S2 is executed. On the other hand, when it is determined that the processing of all the exposure regions has been completed, the process proceeds to S108 of FIG. 4.

In S108, the substrate 2 is unloaded from the substrate stage 3 to a substrate unloading apparatus (not illustrated). It is determined whether all lots have been completed in S109 and the entire processing process ends when it is determined that all the lots are completed. On the other hand, when it is determined that not all the lots have been completed, the process is iterated from S101.

Information stored in the above process, that is, approximate surface information of the first substrate and an exposure position of each shot region, is used when second and subsequent substrates (second substrates) serve as substrates that are the targets of exposure. The exposure position includes a position of at least a height direction. Also, when the approximate surface information of the substrate and the exposure position of each shot region are pre-stored in the storage unit 18, a sequence in which the second substrate shown below serves as a processing target from the first substrate may be executed without performing the above process.

Figure 9:
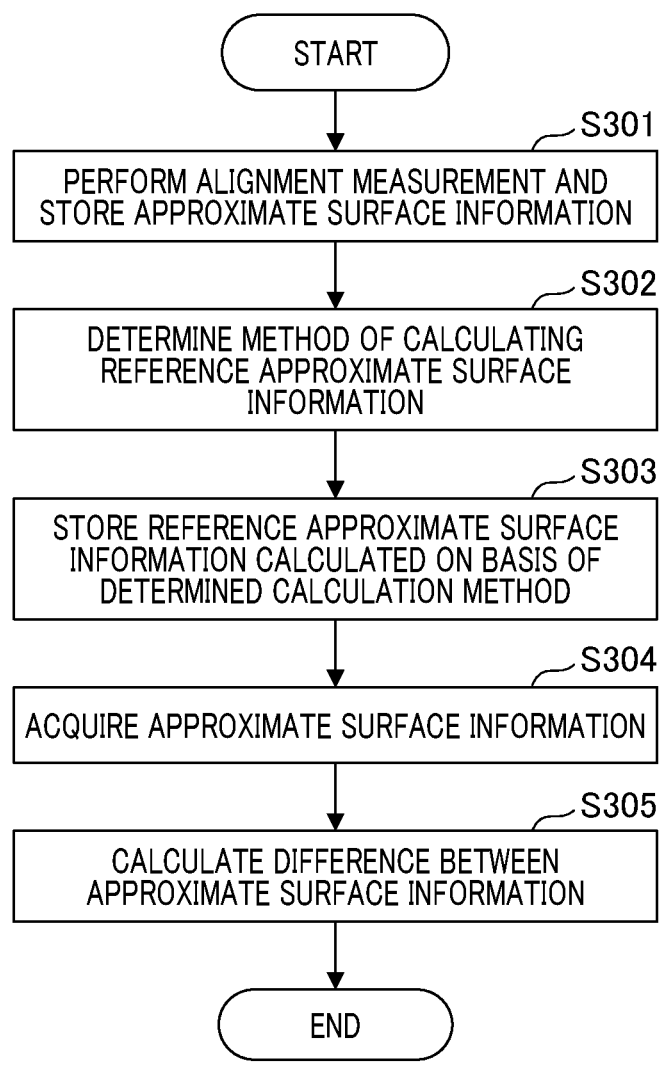
FIG. 9 is a flowchart illustrating a flow of a process of calculating a difference between approximate surface information.

Next, the sequence when the second substrate (the number of substrates to be processed is 2) of the lot serves as the processing target will be described. First, the substrate loading apparatus (not illustrated) loads the substrate 2 which is the next processing target onto the substrate stage 3 (S101). Next, in S102, it is determined whether the number of substrates to be processed is greater than 1. Because the substrate is the second substrate of the lot, it is determined to be greater and the process proceeds to step S103. In S103, the approximate surface information of the second substrate (temporary height information indicating a temporary height of the substrate) is compared with the approximate surface information of the first substrate and a difference (between the first reference information and the temporary height information) of the approximate surface information (the height of the substrate) is calculated. The difference between the approximate surface information is also information indicating a distribution of a difference between the thickness of the first substrate and the thickness of the second substrate. In FIG. 9, details of this process will be described. First, as in S104, the height of the substrate is measured in parallel with the alignment measurement in each sample shot region of the second substrate, a value (approximate surface information) related to the height of the substrate is calculated on the basis of each measured value, and a calculation result is stored in the storage unit 18 (S301). Next, the approximate surface information of the first substrate and the approximate surface information of the second substrate stored in the storage unit 18 by the control unit 13 are acquired (S304). The control unit 13 calculates a difference between the approximate surface information by comparing the approximate surface information of the first substrate with the approximate surface information of the second substrate (S305). Also, when third and subsequent substrates of the same lot are processed, the method of calculating the approximate surface information (reference value) serving as a comparison reference is determined before S304 (S302). Further, the approximate surface information (reference value) calculated on the basis of the determined calculation method is stored in the storage unit 18 (S303).

The determination of the calculation method in S302 is performed according to input content of the parameter 92 of the console unit 19. As the calculation method, for example, a method using the mean or the median of the approximate surface information (heights) of a plurality of substrates for which the processing of the same lot is completed or using the approximate surface information of the substrate for which the processing is completed one substrate before in the same lot is considered. Also, the approximate surface information of the processed substrate is a value calculated in S301 or S104 and stored in the storage unit 18.

The difference between the approximate surface information calculated in S103 is compared with a threshold value 93 (height) and a threshold value 94 (tilt) input to the console unit 19 in S105. That is, it is determined whether a difference between the approximate surface information of the first substrate and the approximate surface information of the second substrate is in a tolerance range. On the basis of a determination result, ON/OFF of a flag (hereinafter simply referred to as a "stop flag") indicating that driving for a predictive exposure position stops is determined. When it is determined that the difference exceeds the threshold value (or is out of the tolerance range), it is determined that the exposure position of the substrate 2 stored in the storage unit 18 is not usable and the stop flag is set to ON in S106.

When it is determined that the difference does not exceed the threshold value (or is in the tolerance range) in S105, an exposure sequence illustrated in FIG. 5 is executed in S107 subsequent to S106. When it is determined that the difference is less than the threshold value in S105, an exposure sequence illustrated in FIG. 5 is executed in S107 subsequent to S105. First, it is determined whether the number of substrates to be processed is greater than 1 in S201. Because the second substrate of the lot is processed here, it is determined to be greater and the process proceeds to S202. In S202, it is determined whether the stop flag is OFF. When it is determined that the stop flag is ON, a sequence equivalent to the case in which the first substrate of the lot is exposed is executed. On the other hand, when it is determined that the stop flag is OFF, the process proceeds to S203.

Figure 10:
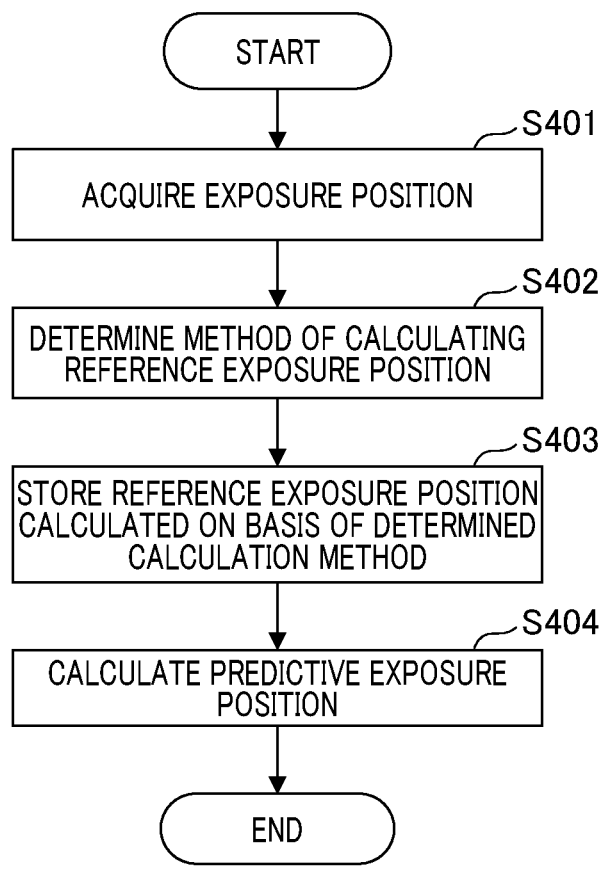
FIG. 10 is a flowchart illustrating a flow of a predictive exposure position calculation process.

In S203, the predictive exposure position of the shot region of the second substrate is calculated on the basis of the exposure position of the shot region of the first substrate stored in the storage unit 18 in S214 and the difference between the approximate surface information obtained in S103. In FIG. 10, details of this process will be described. The case in which a first shot region (for example, a shot region S1 illustrated in FIG. 8) of the second substrate is exposed is considered. In S401, the exposure position of the shot region S1 of the first substrate saved in the storage unit 18 in S214 is read. In S404, the read exposure position of the shot region S1 of the first substrate is set as a reference exposure position (second reference information indicating the reference height of one exposure region among the plurality of exposure regions). A predictive exposure position is calculated by subtracting the difference between the approximate surface information obtained in S103 from the reference exposure position.

The following processes of S402 and S403 are necessary from a third substrate. In S402, a method of calculating a reference exposure position (reference value) is determined. In S403, the reference exposure position (reference value) is calculated from the exposure position acquired from the storage unit 18 in S401 on the basis of the determined calculation method. Here, the exposure positions to be read include the exposure positions of the second and subsequent substrates stored in S207 and S210 as well as the exposure position of the first substrate stored in S214. Also, the determination of the calculation method in S402 is performed according to input content of the parameter 92 of the console unit 19 as in S302. Here, when the mean or the median is used in S302, it is desirable that the calculation method selected in S402 be the same.

Figure 11:
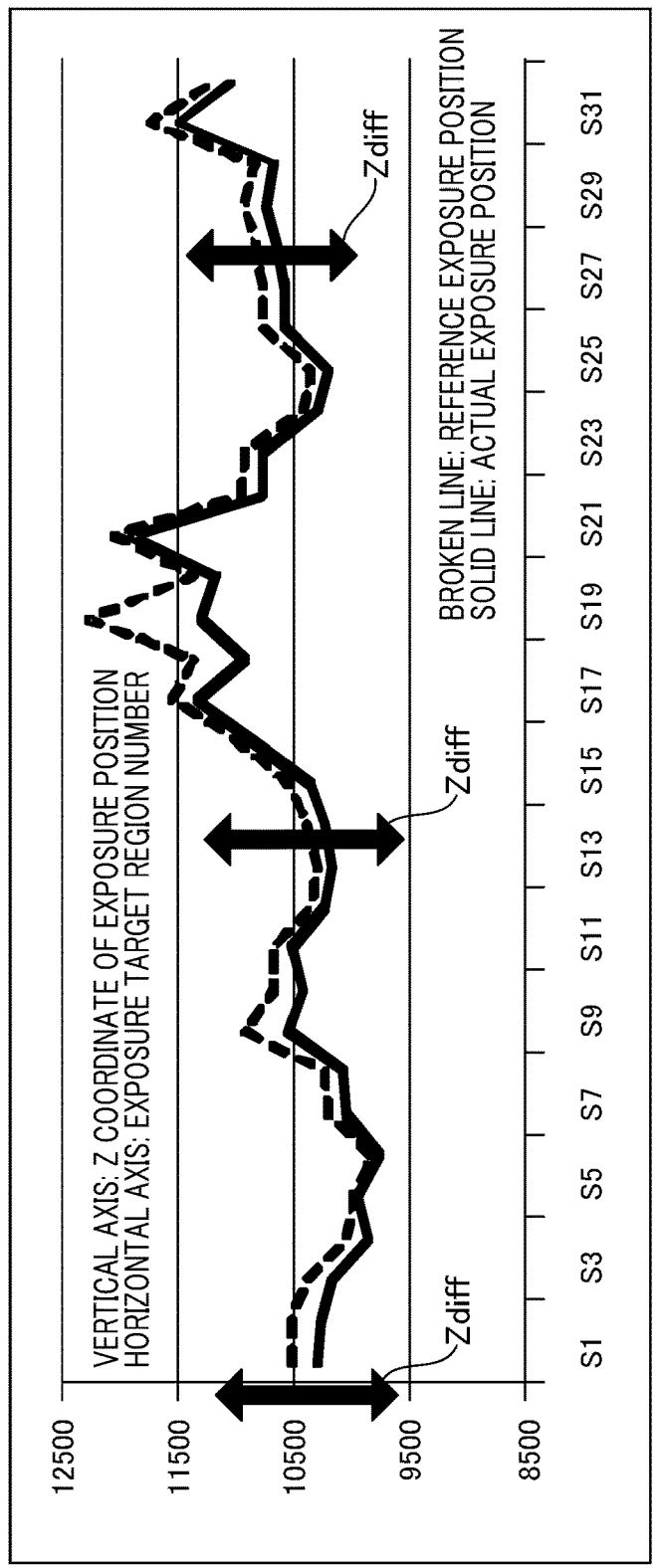
FIG. 11 is a graph for comparing a reference exposure position and an actual exposure position.

FIG. 11 is a graph for comparing a reference exposure position (broken line) with an actual exposure position (solid line) when the difference obtained in S103 is not considered, that is, when the driving for the predictive exposure position is not performed. In FIG. 11, the vertical axis represents a Z-axis coordinate of the exposure position and the horizontal axis represents a number of an exposure region (shot region). From FIG. 11, it can be seen that there is an error between a reference exposure position and an actual exposure position.

Figure 12:
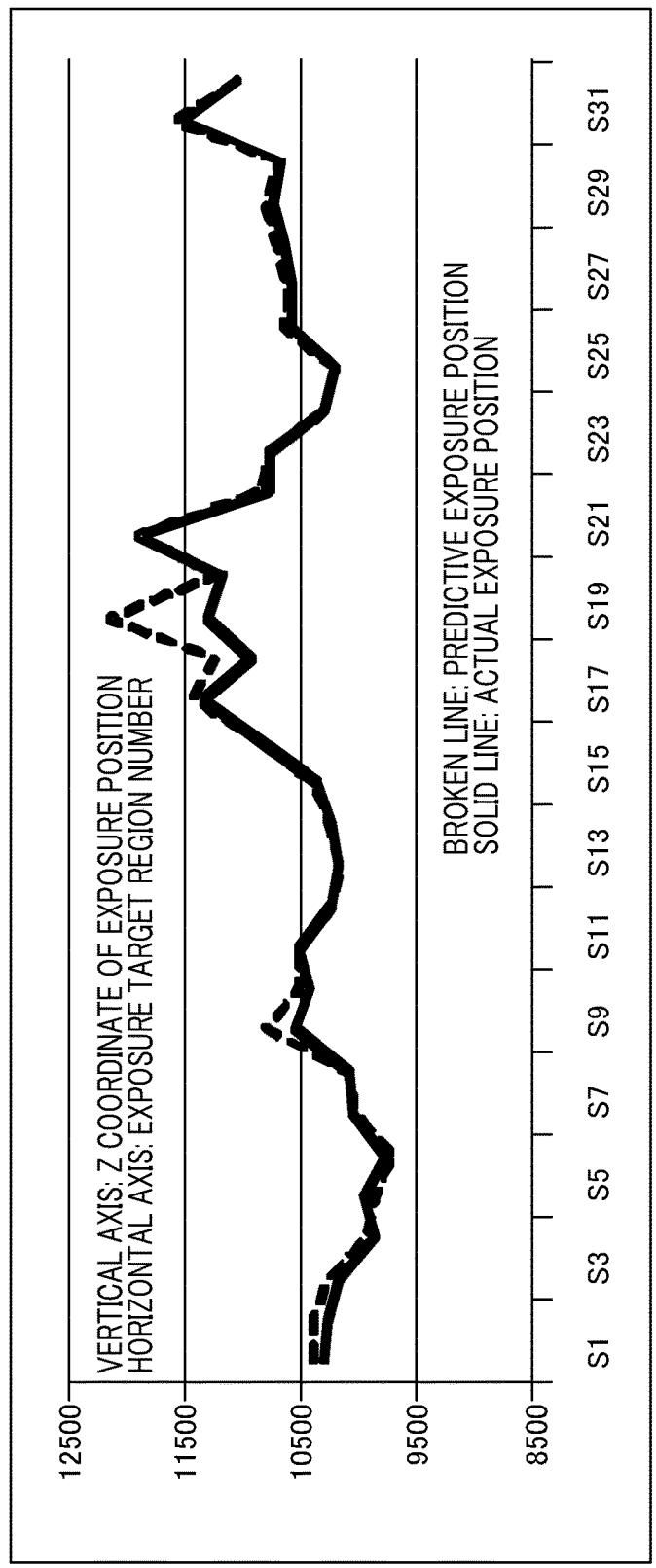
FIG. 12 is a graph for comparing a predictive exposure position and an actual exposure position.

FIG. 12 is a graph for comparing the predictive exposure position (broken line) calculated in S404 with the actual exposure position (solid line) when a difference Zdiff obtained in S103 is considered, that is, for the driving for the predictive exposure position. From FIG. 12, it can be seen that the error is small. That is, focusing precision is improved.

In S204, the substrate stage 3 (substrate 2) is moved to the predictive exposure position calculated in S203. Predictive exposure positions are obtained for six degrees of freedom of X, Y, Z, Qx, Qy, and Qz. Accordingly, it is possible to simultaneously execute the movement in the XY plane (a planar direction along the surface of the substrate 2 and a planar direction intersecting a height direction of some exposure regions), the movement in the Z-axis direction, and the movement in the rotation direction of each axis for the substrate 2. In S205, focus measurement is executed. A focus measurement value is compared with values input to the threshold values 95 (the threshold value of the Z-axis direction) and 96 (the threshold value of the tilt) of the console unit 19 and it is determined to which of S207 and S209 the process will proceed on the basis of a comparison result (S206). When it is determined that the focus measurement value is within the threshold value, an exposure position is stored in the storage unit 18 simultaneously when an exposure process is executed in S207. On the other hand, when it is determined that the focus measurement value exceeds the threshold value, focusing drive is performed in S209 and the exposure position is stored in the storage unit 18 simultaneously when the exposure process is executed in S210. Also, the value stored in S207 or S210 is position coordinates similar to those of S214 and may be a value reflecting a focus error obtained by measuring the focus during exposure. Finally, in S208, it is determined whether the processing of all exposure regions has been completed. When it is determined that the processing of all exposure regions has not been completed, the process returns to S201 to re-execute the exposure process. In the example illustrated in FIG. 8, the movement from the shot region S1 to the shot region S2 is performed and the exposure process for the shot region S2 is executed. On the other hand, when it is determined that the processing of all the exposure regions has been completed, the process proceeds to S108 of FIG. 4. Also, the process subsequent to S108 is the same as described above.

Figure 13:
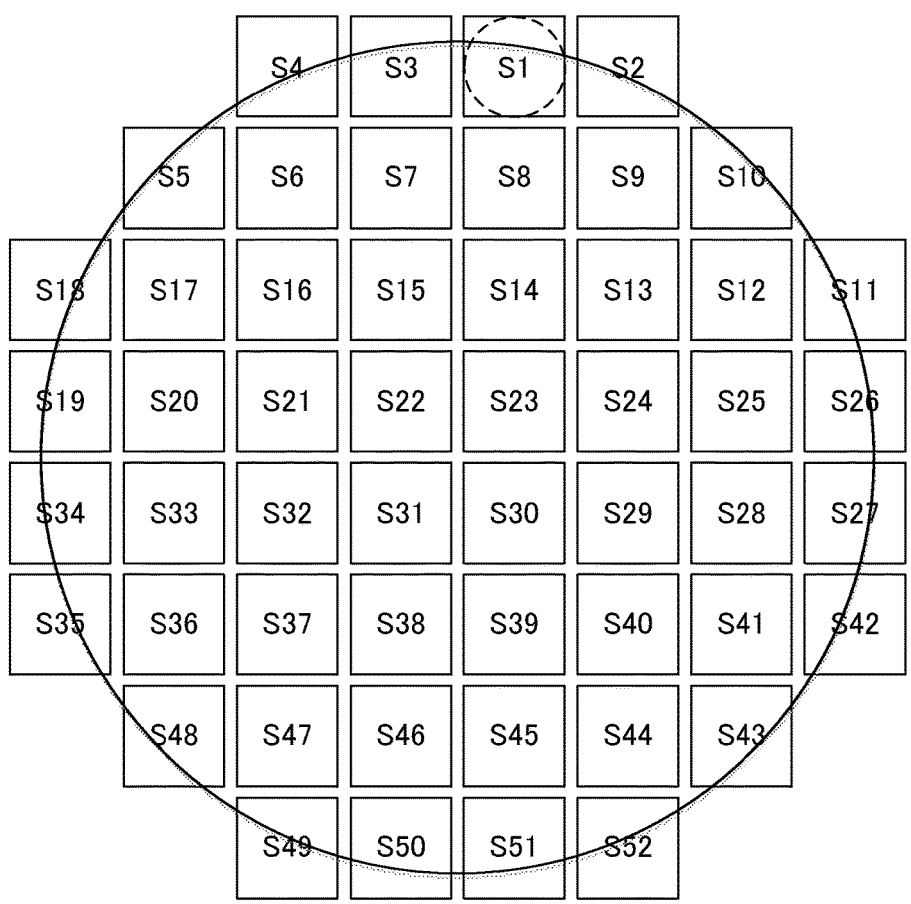
FIG. 13 is a diagram illustrating an exposure order of a first substrate of a lot.
Figure 14:
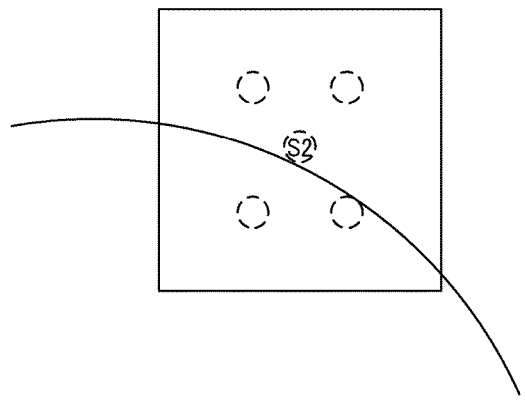
FIG. 14 is a diagram illustrating an arrangement relation between a shot region S2 of FIG. 13 and a measurement point.

Next, the order in which the shot region of the substrate is exposed will be described. FIG. 13 is a diagram illustrating an exposure order of a first substrate of the lot. In the first substrate of the lot, exposure is performed in the order of shot regions S1, S2, ... of FIG. 13. As illustrated in FIG. 14, measurement can be performed at only two measurement points among five measurement points (indicated by reference numerals 21 to 25 of FIG. 2) for the shot region S2 positioned at an end in an array direction. Thus, it is not possible to measure a tilt in a predetermined direction. Therefore, the shot region S1 in which the height is measurable, that is, in which the tilt is measurable, at three or more measurement points, is first exposed, the shot region S2 is exposed by performing focus drive using a measured value obtained during exposure, and then the exposure is performed in the order of the shot regions S3 and S4.

Figure 15:
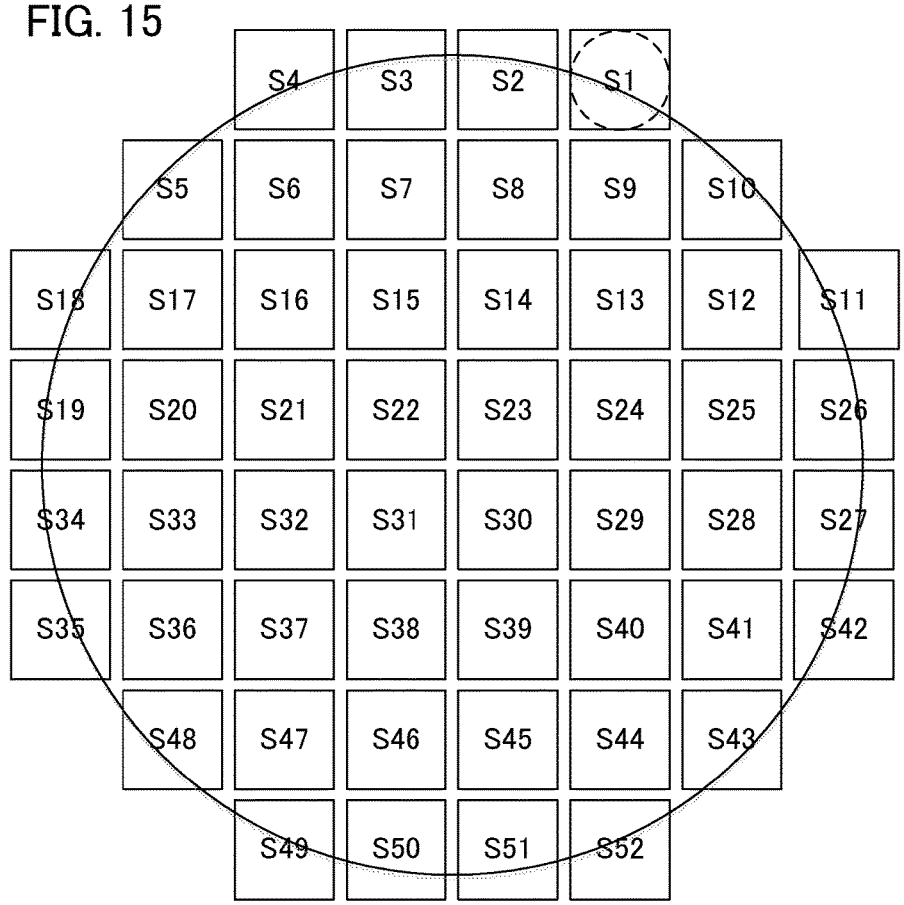
FIG. 15 is a diagram illustrating an exposure order of a substrate from a second sheet of a lot.

FIG. 15 is a diagram illustrating the exposure order of second and subsequent substrates of the lot. In the second and subsequent substrates, the exposure is performed in the order of shot regions S1, S2, ... of FIG. 15. In FIG. 15, it is possible to improve throughput more than in the exposure order of FIG. 13 by performing the exposure in order from the shot region positioned at the end in the array direction. Also, both the throughput and the focus precision can be satisfied because the predictive exposure position is calculated as described above and used in correction drive.

The above-described exposure method can shorten focus drive and improve throughput without decreasing focusing precision in an apparatus for sequentially performing focus drive in a large number of shot regions.

As described above, according to this embodiment, it is possible to provide an exposure apparatus which is advantageous in terms of focusing precision and throughput.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a latent image pattern on an object (e.g., exposure process) using the aforementioned exposure apparatus; and a step of developing the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-083484 filed on Apr. 15, 2015, and Japanese Patent Application No. 2016-067408 filed Mar. 30, 2016, which are hereby incorporated by reference herein in their entirety.

What is claimed is:

1. An exposure method of exposing a plurality of exposure regions on a substrate, the exposure method comprising the steps of:
   acquiring first height information, calculated on the basis of a height of at least one of a plurality of substrates exposed before a target substrate to be exposed, indicating a reference height with respect to the plurality of substrates;
   measuring heights of some exposure regions among a plurality of exposure regions on the target substrate;
   acquiring second height information indicating a height of the target substrate on the basis of a measurement result in the measuring step; and
   calculating a height of one exposure region among a plurality of exposure regions on the target substrate on the basis of third height information indicating a reference height with respect to the one exposure region, the first height information and the second height information;
   exposing the one exposure region on the target substrate after the target substrate is moved on the basis of the height of the one exposure region calculated in the calculating step.

2. The exposure method according to claim 1, comprising the step of:
   determining whether a difference between the first height information and the second height information is in a tolerance range,
   wherein the calculating step is performed when the difference is in the tolerance range.

3. The exposure method according to claim 1, wherein the measuring step is performed in parallel with measuring a position of a planar direction intersecting a height direction of some exposure regions.

4. The exposure method according to claim 1, wherein the first height information is information calculated using a mean or a median of heights of the plurality of the substrates.

5. The exposure method according to claim 1, wherein the third height information is information calculated on the basis of a height of one exposure region on at least one, exposed before the target substrate at a position corresponding to the one exposure region on the target substrate, of the plurality of the substrates.

6. The exposure method according to claim 1, wherein the third height information is calculated using a mean of a plurality of values or one of the plurality of values indicating a height of one exposure region on each, exposed before the target substrate at a position corresponding to one exposure region on the target substrate among the plurality of substrates, of a plurality of substrates.

7. The exposure method according to claim 1, wherein the plurality of substrates are included in a same lot.

8. The exposure method according to claim 7, wherein, when heights cannot be measured at three or more measurement points in an exposure region positioned at an end of a predetermined array direction in a first substrate of the lot, an exposure region different from the exposure region at the end and in which heights are measurable at three or more measurement points is first exposed and determines an exposure order so that the exposure region positioned at the end is first exposed in a second substrate of the lot.

9. The exposure method according to claim 1, wherein the exposing step comprises the steps of:
   measuring a height of the one exposure region after the target substrate is moved to the height of the one exposure region calculated in the calculating step; and
   determining whether to move the substrate again on the basis of a measurement result in the measuring step before exposing the one exposure region.

10. The exposure method according to claim 1, wherein the height of the one exposure region is calculated on the basis of the third height information and a difference between the first height information and the second height information in the calculating step.

11. An exposure method of exposing a plurality of exposure regions on a substrate, the exposure method comprising the steps of:
   acquiring first height information of a first substrate, exposed before a second substrate different from the first substrate, on the basis of height information of at least some exposure regions among a plurality of exposure regions on the first substrate;
   acquiring second height information of the second substrate on the basis of height information of at least some exposure regions among a plurality of exposure regions on the second substrate;
   calculating a predictive height of a second exposure region, among the plurality of exposure regions on the second substrate, at a position corresponding to a first exposure region among the plurality of exposure regions on the first substrate on the basis of height information of the first exposure region, the first height information and the second height information; and
   exposing the second exposure region after the second substrate is moved to the predictive height calculated in the calculating step.

12. The exposure method according to claim 11, wherein the predictive height is calculated on the basis of the height information of the first exposure region and a difference between the first height information and the second height information in the calculating step.

13. The exposure method according to claim 11, comprising the step of: determining whether a difference between the first height information and the second height information is in a tolerance range,
   wherein the calculating step is performed when the difference is in the tolerance range.

14. The exposure method according to claim 11, wherein the first substrate and the second substrate are included in a same lot.

15. The exposure method according to claim 11, wherein the exposing step comprises the steps of:
   measuring a height of the second exposure region after the second substrate is moved to the predictive height;
   determining whether to move the second substrate again on the basis of a measurement result in the measuring step before exposing the second exposure region.

\* \* \* \* \*